(12) United States Patent
Uemura et al.

(10) Patent No.: US 8,379,397 B2
(45) Date of Patent: Feb. 19, 2013

(54) CIRCUIT BOARD AND ELECTRONIC DEVICE WITH THE SAME

(75) Inventors: Tsunehito Uemura, Aichi (JP); Hiroshi Ueno, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 242 days.

(21) Appl. No.: 12/630,749

(22) Filed: Dec. 3, 2009

(65) Prior Publication Data

US 2010/0142163 A1 Jun. 10, 2010

(30) Foreign Application Priority Data

Dec. 5, 2008 (JP) ................................. 2008-311136

(51) Int. Cl.
*H05K 5/00* (2006.01)

(52) U.S. Cl. .......................... 361/752; 361/807; 361/809

(58) Field of Classification Search .................. 361/752, 361/753, 742, 758, 770, 772, 777, 730, 807, 361/809, 810; 174/138 E, 138 G
See application file for complete search history.

(56) References Cited

U.S. PATENT DOCUMENTS

| | | | | |
|---|---|---|---|---|
| 4,546,408 A * | 10/1985 | Rodseth et al. | ............... | 361/720 |
| 5,420,378 A * | 5/1995 | Estes et al. | ..................... | 174/263 |
| 5,500,789 A * | 3/1996 | Miller et al. | .................... | 361/816 |
| 5,886,878 A * | 3/1999 | Khadem et al. | ................ | 361/770 |
| 6,262,887 B1 * | 7/2001 | Lee | ........................... | 361/679.27 |
| 6,295,210 B1 * | 9/2001 | Lanzone et al. | ............... | 361/799 |
| 6,955,544 B2 * | 10/2005 | Miquel et al. | ................. | 439/76.1 |
| 7,060,595 B2 * | 6/2006 | Ou et al. | ........................ | 438/484 |
| 7,227,761 B2 * | 6/2007 | Estes et al. | ..................... | 361/810 |
| 7,544,064 B2 * | 6/2009 | Gilliland | ......................... | 439/74 |
| 7,567,441 B2 * | 7/2009 | Monda et al. | .................. | 361/752 |
| 7,898,820 B2 * | 3/2011 | Kao et al. | ....................... | 361/807 |
| 8,027,164 B2 * | 9/2011 | Peck | .............................. | 361/730 |
| 8,077,472 B2 * | 12/2011 | Liu | ................................. | 361/753 |
| 8,193,453 B2 * | 6/2012 | Hasegawa et al. | ............ | 174/255 |
| 2004/0120124 A1 * | 6/2004 | Cauwels | ........................ | 361/752 |
| 2008/0310130 A1 * | 12/2008 | Monda et al. | .................. | 361/752 |

FOREIGN PATENT DOCUMENTS

| | | |
|---|---|---|
| JP | 56-155496 A | 11/1981 |
| JP | 6-310819 A | 11/1994 |
| JP | 07-045973 | 2/1995 |

(Continued)

OTHER PUBLICATIONS

Office Action dated Jun. 12, 2012 issued in corresponding JP application and partial English translation thereof.
Corresponding Japanese Office Action 2012-159533 mailed on Aug. 28, 2012 and partial English translation.

*Primary Examiner* — Hung S Bui
(74) *Attorney, Agent, or Firm* — Roberts Mlotkowski Safran & Cole P.C.

(57) ABSTRACT

A circuit board is fixed to a housing including a boss-like fixing part by being fastened by a fixing tool. The circuit board includes a printed portion formed in a region that the circuit board contacts with the housing. The printed portion includes a lattice printed portion formed by silk screening on a periphery of a fixing hole through which the fixing tool is inserted, and a ring printed portion formed by silk screening on a periphery of the lattice printed portion. The lattice printed portion includes a non-printed region, and the ring printed portion includes no non-printed region.

13 Claims, 5 Drawing Sheets

FOREIGN PATENT DOCUMENTS

| JP | 2007-123780 | | 5/2007 |
| JP | 2008-177420 | A | 7/2008 |
| JP | 2008-258501 | A | 10/2008 |
| WO | WO2006023294 | * | 3/2006 |

* cited by examiner

CIRCUIT BOARD AND ELECTRONIC DEVICE WITH THE SAME

The present application is based on Japanese patent application No. 2008-311136 filed on Dec. 5, 2008, the entire contents of which are incorporated herein by reference.

BACKGROUND OF THE INVENTION

1. Field of the Invention

This invention relates to a circuit board and an electronic device equipped with the circuit board.

2. Description of the Related Art

Conventionally electronic devices are constructed such that a circuit board with an electronic parts mounted thereon is enclosed in a housing, and the circuit board is fixed to a part of the housing by screws passing through a fixing hole formed in the circuit board (See, e.g., JP-A-2008-258501). The circuit board is provided with a conductive pattern on the periphery of the fixing hole. Thereby, when the circuit board is fixed to the housing by screws, it can be electrically connected to the housing through the conductive pattern.

On the other hand, silk-screen prints are generally provided on the surface of the circuit board for displaying the voltage value of a power source line pattern or the circuit composition (See, e.g., JP-A-2008-177420). In the circuit board, the silk-screen prints formed on the surface of the circuit board serve to display the mounted circuit parts or voltage value etc. The silk-screen prints are generally used in the circuit board for the display purpose.

However, the circuit board in JP-A-2008-258501 is fixed to the surface of the housing by the fastening power of the screw, so that abnormal noise may arise upon the lateral displacement between the circuit board and the surface of the housing when the circuit board contracts due to temperature change in the interior of the electronic device or the housing.

The silk-screen prints in JP-A-2008-177420 are generally used in the circuit board, but they were used only for the display purpose.

SUMMARY OF THE INVENTION

It is an object of the invention to provide a circuit board and an electronic device equipped with the circuit board that can prevent or suppress abnormal noise upon the lateral displacement between the circuit board and the surface of the housing due to temperature change in the interior of the electronic device or the housing, without increasing the manufacturing cost, by using a material generally used for the circuit board.

(1) According to one embodiment of the invention, a circuit board for being fixed to a housing comprising a boss-like fixing part by being fastened by a fixing tool comprises:

a printed portion formed in a region that the circuit board contacts with the housing.

In the above embodiment (1), the following modifications and changes can be made.

(i) The printed portion comprises a lattice printed portion formed by silk screening on a periphery of a fixing hole through which the fixing tool is inserted, and a ring printed portion formed by silk screening on a periphery of the lattice printed portion.

(ii) The lattice printed portion includes a non-printed region, and the ring printed portion includes no non-printed region.

(iii) The ring printed portion is formed such that an outside diameter of the boss-like fixing part is located inside of the ring printed portion.

(2) According to another embodiment of the invention, an electronic device comprises:

a housing comprising a boss-like fixing part; and a circuit board for being fixed to the housing by being fastened by a fixing tool, the circuit board comprising a printed portion formed in a region that the circuit board contacts with the housing.

In the above embodiment (2), the following modifications and changes can be made.

(iv) The printed portion comprises a lattice printed portion formed by silk screening on a periphery of a fixing hole through which the fixing tool is inserted, and a ring printed portion formed by silk screening on a periphery of the lattice printed portion.

(v) The lattice printed portion includes a non-printed region, and the ring printed portion includes no non-printed region.

(3) According to another embodiment of the invention, an electronic device comprises:

a first housing comprising a boss-like fixing part;

a second housing for forming a housing by being combined with the first housing; and a circuit board for being fixed between the first housing and the second housing by being fastened by a fixing tool, the circuit board comprising a printed portion formed in a region that the circuit board contacts with the boss-like fixing part of the first housing.

In the above embodiment (3), the following modifications and changes can be made.

(vi) The printed portion comprises a lattice printed portion formed by silk screening on a periphery of a fixing hole through which the fixing tool is inserted, and a ring printed portion formed by silk screening on a periphery of the lattice printed portion.

(vii) The lattice printed portion includes a non-printed region, and the ring printed portion includes no non-printed region.

Points of the Invention

According one embodiment of the invention, a circuit board is constructed such that, by being fastened by screws, the front surface of a boss-like fixing part contacts strong with a printed portion (e.g., silk-screen prints) that includes a lattice printed portion and a ring printed portion formed on the circuit board corresponding to the boss-like fixing part. Here, the housing is formed of a resin such as ABS and the silk-screen prints are formed of a high hardness epoxy ink. Therefore, the printed portion, especially, the ink part of the lattice printed portion bites into the contact face of the boss-like fixing part to increase the static friction force (or coefficient) for preventing or suppressing abnormal noise upon the lateral displacement between the circuit board and the surface of the housing due to temperature change.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
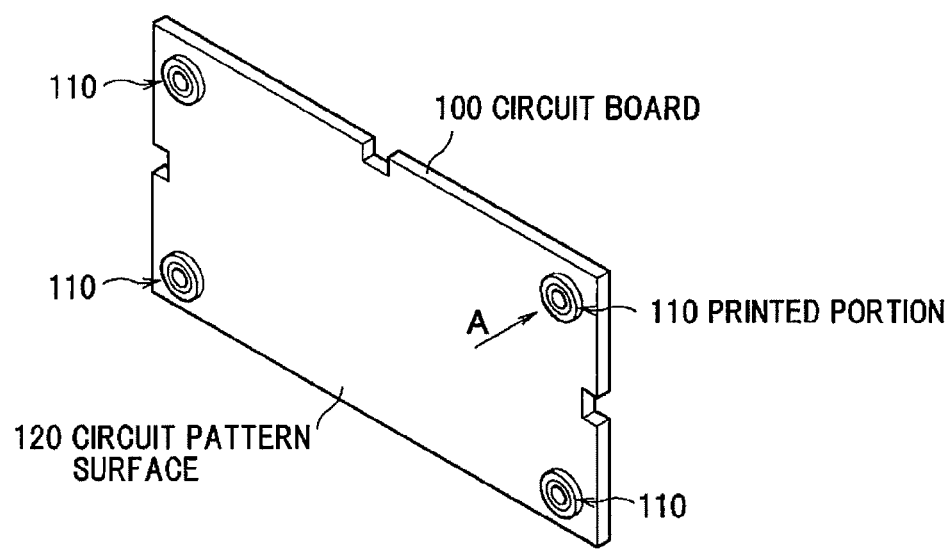
FIG. 1 is a perspective view showing a circuit board in a preferred embodiment according to the invention.
Figure 2:
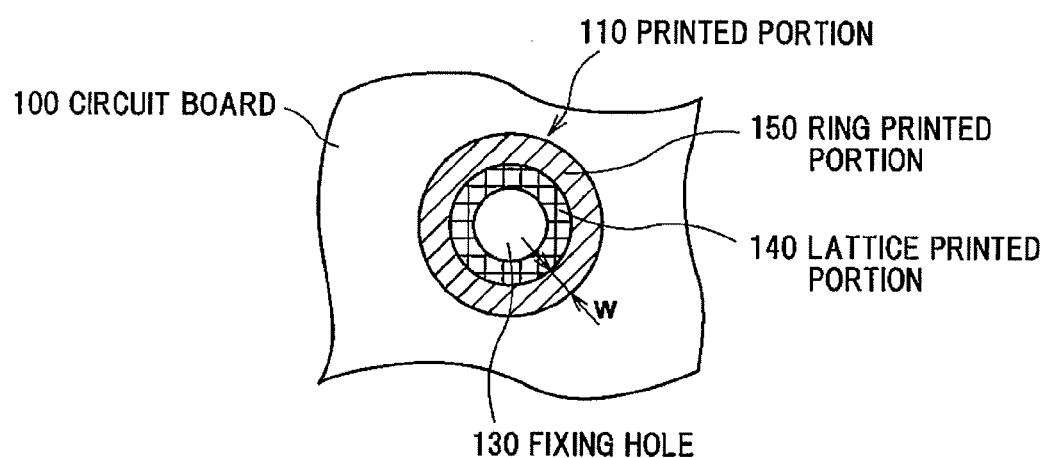
FIG. 2 is an enlarged plan view showing a printed portion which is viewed in a direction A in FIG. 1.
Figure 3:
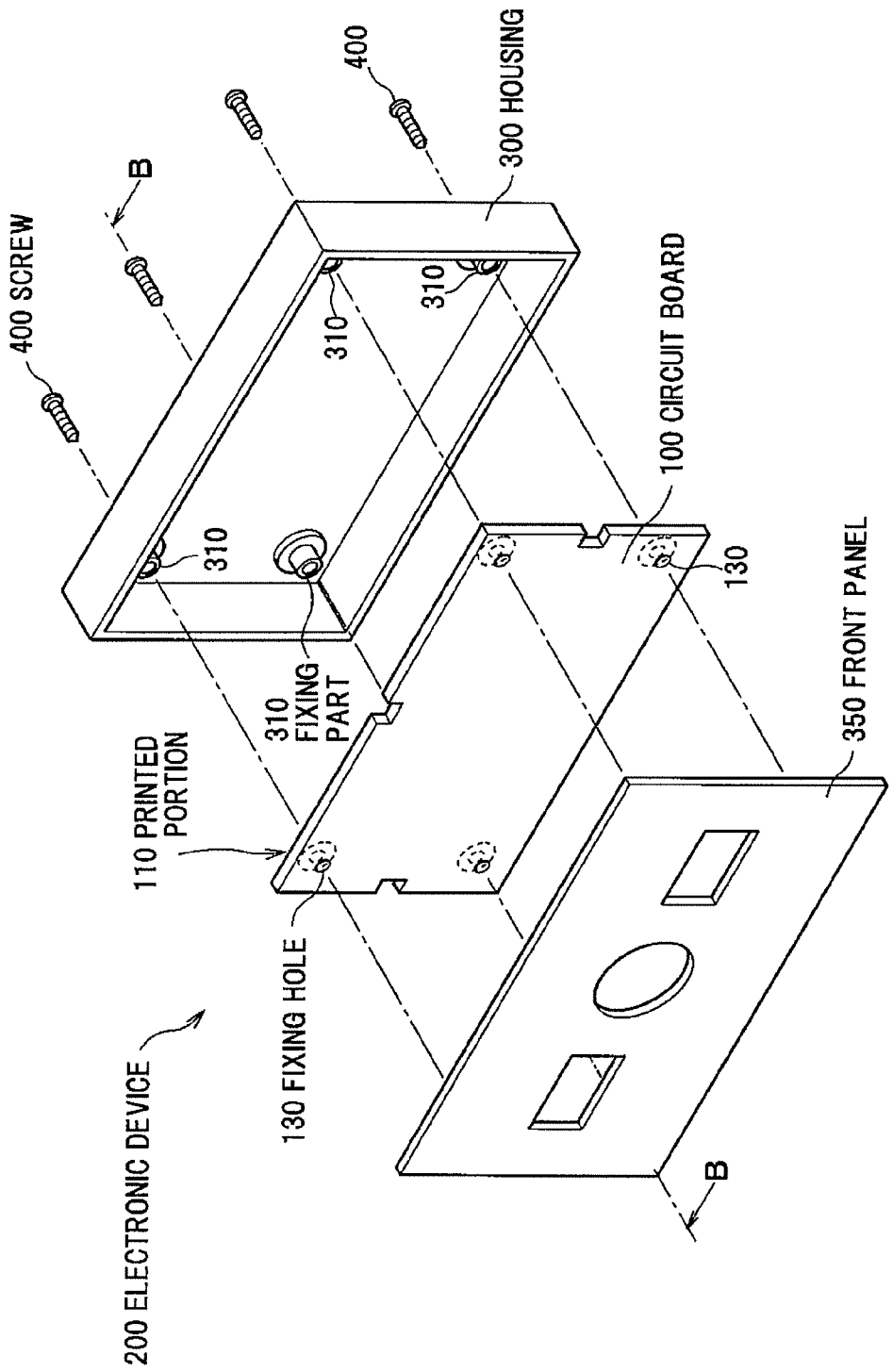
FIG. 3 is an exploded perspective view showing an electronic device with the circuit board housed therein.
Figure 4:
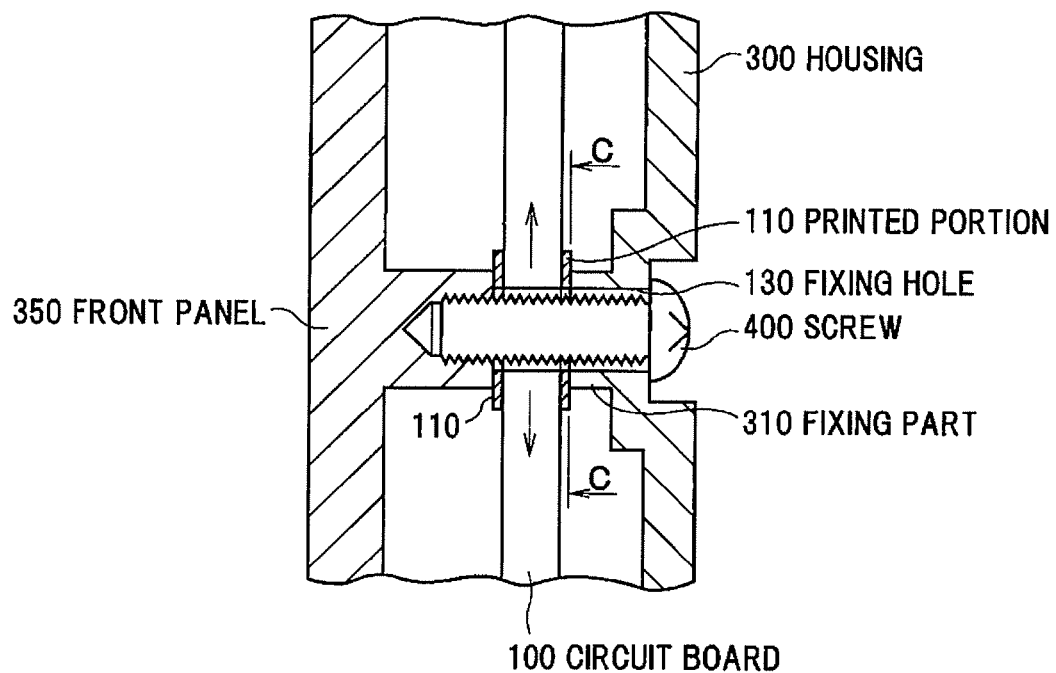
FIG. 4 is a cross sectional view cut along a line B-B in an assembled state of the electronic device in FIG. 3.
Figure 5:
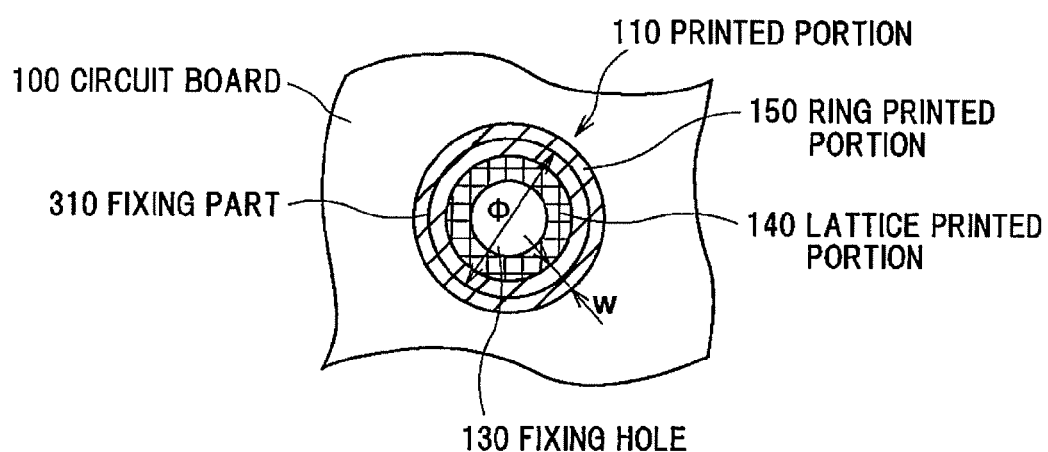
FIG. 5 is a cross sectional view cut along a line C-C in FIG. 4.

The preferred embodiments according to the invention will be explained below referring to the drawings. FIG. 1 is a perspective view showing a circuit board in a preferred embodiment according to the invention. FIG. 2 is an enlarged plan view showing a printed portion which is viewed in a direction A in FIG. 1. FIG. 3 is an exploded perspective view showing an electronic device with the circuit board housed therein. FIG. 4 is a cross sectional view cut along a line B-B in an assembled state of the electronic device in FIG. 3. FIG. 5 is a cross sectional view cut along a line C-C in FIG. 4.

The circuit board 100 of the embodiment is constructed such that it is fixed to a housing 300 as a first housing with a boss-like fixing part 310 by being fastened by screws 400 as a fixing tool, and provided with a printed portion 110 in a region where it contacts with the housing 300.

As shown in FIG. 1, a circuit pattern surface 120 with a circuit pattern formed thereon is provided on the front surface (at the front side) of the circuit board 100. On the circuit pattern surface 120 are provided a wiring pattern for connecting circuit elements mounted thereon, a throughhole for providing electrical connection with the back surface, and a land for connecting the wiring pattern and the circuit element etc. Also, silk-screen prints are formed thereon for displaying a lot of information. The silk-screen prints are formed at places in need for identifying the circuit elements mounted, the model number of the circuit board, and the voltage applied etc. Also, on the back surface may be provided circuit elements, wiring patterns, and silk-screen prints etc. if necessary.

The silk-screen prints are formed of, e.g., an epoxy white ink. The silk-screen prints formed on the surface of the circuit board 100 form a rigid coating (with a hardness of 8H, adherence 100/100<JIS K5400>) that may endure a severe environment such as solder reflow.

FIG. 2 is an enlarged plan view showing a printed portion 110 (i.e., silk-screen prints) which is viewed in a direction A in FIG. 1. The circuit board 100 is provided with fixing holes 130 through which the screws 400 pass for fixing the circuit board 100 to the housing 300. The fixing holes 130 have an inside diameter greater than an outside diameter (thread diameter) of the screws 400. Thereby, the accuracy of the inside diameter of the fixing holes 130 formed in the circuit board 100 can be relaxed, and the position accuracy of the fixing holes 130 formed at several places can be relaxed.

A lattice printed portion 140 is formed on the periphery of the fixing holes 130. The lattice printed portion 140 is formed such that silk-screen prints are printed like a lattice in that region and not printed on the entire surface of the region. The lattice is formed by vertical and horizontal stripes, but may be formed into a mesh that is composed of a combination of vertical, horizontal and oblique lines or curves. The lattice stripe of the silk-screen prints is 0.15 cm in line width. A ring printed portion 150 is formed on the periphery of the lattice printed portion 140. The ring printed portion 150 is formed such that silk-screen prints are printed like a ring in a predetermined width W. In the ring printed region, the silk-screen print is formed on the entire surface thereof. Thus, the printed portion 110 is composed of the lattice printed portion 140 and the ring printed portion 150.

FIG. 3 is an exploded perspective view showing an electronic device 200 with the circuit board housed therein. The electronic device 200 is schematically composed of the housing 300 as the first housing, the circuit board 100 enclosed in the housing 300 for mounting electronic parts etc., and a front panel 350 as a second housing for being combined with the housing 300 to have an integrated housing. The front panel 350 may be provided with operating buttons or switches, display area etc. arranged thereon, but they are omitted in FIG. 3.

The housing 300 is formed by molding a resin such as ABS, and provided with the boss-like fixing part 310 for fixing the circuit board 100 to a predetermined position thereof. The fixing part 310 is formed inside the housing 300 and protrudes toward the side where the circuit board 100 is attached.

FIG. 4 is a cross sectional view cut along a line B-B in an assembled state of the electronic device in FIG. 3. The circuit board 100 is sandwiched between the housing 300 and the front panel 350. It is fastened by the screws 400 between the two members.

The fixing part 310 of the housing 300 is provided with a screw hole 311 through which the screw 400 passes and which has a diameter greater than the outside diameter (thread diameter) of the screw 400. The screw 400 is threadably engaged to the front panel 350. Although the front panel 350 may be a preformed member to which the screw 400 can be threadably engaged, it only has to have a hole smaller than the outside diameter of the screw 400 when the screw 400 is a tapping screw. In FIG. 4, an example is shown that the screw 400 is a tapping screw.

The circuit board 100 is fastened by both the housing 300 and the front panel 350, and contacts with the boss-like fixing part 310 at the printed portion 110. Although it similarly contacts with the front panel 350 at the printed portion 110 on the side of the front panel 350, only the contact on the side of the housing 300 will be explained below.

FIG. 5 is a cross sectional view cut along a line C-C in FIG. 4. As shown in FIG. 5, where the outside diameter of the boss-like fixing part 310 is defined as $\phi$, the outside diameter $\phi$ of the boss-like fixing part 310 is preferably set to be located inside the width W of the ring printed portion 150.

Functions of the Embodiment

As shown in FIG. 4, by being fastened by the screws 400 between the two members, the front surface of the boss-like fixing part 310 contacts strong with the printed portion 110 (i.e., the lattice printed portion 140 and the ring printed portion 150). Here, the housing 300 is formed of a resin such as ABS and the silk-screen prints are formed of a high hardness epoxy ink. Therefore, the printed portion 110, especially, the ink part of the lattice printed portion 140 bites into the contact face of the boss-like fixing part 310. Furthermore, when the outside diameter $\phi$ of the boss-like fixing part 310 is set to be located inside the width W of the ring printed portion 150, the fixing part 310 can contact with the ring printed portion 150 up to the maximum outside diameter thereof so as to increase the static friction force (or coefficient).

In an example, the circuit board 100 is composed such that the lattice printed portion 140 with a diameter of 6 to 8 mm is silk-printed with a line width of 0.15 mm, and it is fixed by the screws 400 to the boss-like fixing part 310 of the housing 300 of resin. In exploding the electronic device for observation, it is confirmed that grooves are formed corresponding to the lattice printed portion 140 on the top surface of the fixing part 310.

Effects of the Embodiment

According to the embodiment of the invention, the following effects can be obtained.

(1) In most cases, where a circuit board is housed and fixed inside an electronic device, the circuit board is fastened by screws while being sandwiched between the housing members. Here, as shown in FIG. 4, there is provided a gap between the outside diameter of the screw 400 and the fixing hole 130 of the circuit board 100. The gap is provided generally at the time of designing so as to relax the accuracy of the inside diameter of the fixing hole 130 and the position accuracy of the fixing holes 130 formed at plural places. However, when the inside of the electronic device is subjected to a variation in temperature, e.g., temperature rise, the circuit board 100 may be thermally expanded to be distorted toward one of arrow directions as shown in FIG. 4, so that the circuit board 100 slides in the lateral direction to be displaced. In the embodiment of the invention, the ink part of the lattice printed portion 140 bites into the contact face of the boss-like fixing part 310, so that the above-mentioned lateral displacement of the circuit board 100 can be effectively prevented or suppressed. Therefore, abnormal noise can be reduced that may occur upon the lateral displacement.

(2) When the electronic device is an on-vehicle device mounted on the interior of a vehicle, some problems may arise that temperature change in the vehicle is large and that abnormal noise occurring upon the lateral displacement causes a reduction in vehicle quality. In case of the on-vehicle device, by using the circuit board 100 of the embodiment of the invention, abnormal noise, e.g., a friction noise such as snapping, occurring upon the lateral displacement of the circuit board 100 caused by the large temperature change in the vehicle can be effectively prevented or suppressed.

(3) The circuit board 100 is generally provided with silk-screen prints for displaying a model number thereof. Thus, when the silk-screen prints are provided corresponding to the fixing part 310, the lateral displacement of the circuit board 100 can be prevented or suppressed without causing an increase in manufacturing cost to reduce the occurrence of the abnormal noise.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth. For example, as shown in FIGS. 3 and 4, the circuit board 100 is fastened by the screws 400 between both of the housing members 300, 350. However, even when the circuit board 100 is fixed to only the housing 300 by the screws, the same effects as the above embodiment can be obtained.

What is claimed is:

1. A circuit board for being fixed to a housing comprising a boss-like fixing part by being fastened by a fixing tool, comprising:
    an electrically non-conductive printed portion formed in a region that the circuit board contacts with the housing,
    wherein the electrically non-conductive printed portion includes a lattice printed portion and a ring printed portion on a periphery of the lattice printed portion, and
    wherein the lattice printed portion and the ring printed portion are adapted to increase frictional engagement between the fixing part of the housing and the circuit board.

2. The circuit board according to claim 1, wherein the lattice printed portion of the electrically non-conductive printed portion is formed by silk screening on a periphery of a fixing hole through which the fixing tool is inserted, and the printed portion further comprises a ring printed portion formed by silk screening on a periphery of the lattice printed portion, and
    wherein the electrically non-conductive printed portion further includes an epoxy ink.

3. The circuit board according to claim 2, wherein the lattice printed portion includes a non-printed region, and the ring printed portion includes no non-printed region.

4. The circuit board according to claim 2, wherein the ring printed portion is formed such that an outside diameter of the boss-like fixing part is located inside of the ring printed portion.

5. The circuit board according to claim 1, further comprising a fixing hole in the circuit board through which the fixing tool is inserted for fixing the circuit board to the housing, and wherein the electrically non-conductive printed portion is formed around the fixing hole.

6. An electronic device, comprising:
    a housing including a boss-like fixing part; and
    a circuit board for being fixed to the housing by being fastened by a fixing tool, wherein the circuit board includes an electrically non-conductive printed portion formed in a region that the circuit board contacts with the housing, and
    wherein the electrically non-conductive printed portion comprises a lattice printed portion and a ring printed portion on a periphery of the lattice printed portion, and
    wherein the lattice printed portion and the ring printed portion are adapted to increase frictional engagement between the fixing part of the housing and the circuit board.

7. The electronic device according to claim 6, wherein the lattice printed portion is formed by silk screening on a periphery of a fixing hole through which the fixing tool is inserted, and the electrically non-conductive printed portion further comprises a ring printed portion formed by silk screening on a periphery of the lattice printed portion, and
    wherein the electrically non-conductive printed portion further includes an epoxy ink.

8. The electronic device according to claim 7, wherein the lattice printed portion includes a non-printed region, and the ring printed portion includes no non-printed region.

9. The electronic device according to claim 6, further comprising a fixing hole in the circuit board through which the fixing tool is inserted for fixing the circuit board to the housing, and wherein the electrically non-conductive printed portion is formed around the fixing hole.

10. An electronic device, comprising:
    a first housing comprising a boss-like fixing part;
    a second housing for forming a housing by being combined with the first housing; and
    a circuit board for being fixed between the first housing and the second housing by being fastened by a fixing tool, the circuit board including an electrically non-conductive printed portion formed in a region that the circuit board contacts with the boss-like fixing part of the first housing, and
    wherein the electrically non-conductive printed portion comprises a lattice printed portion and a ring printed portion on a periphery of the lattice printed portion, and
    wherein the lattice printed portion and the ring printed portion are adapted to increase frictional engagement between the fixing part of the housing and the circuit board.

11. The electronic device according to claim 10, wherein the lattice printed portion is formed by silk screening on a periphery of a fixing hole through which the fixing tool is inserted, and the electrically non-conductive printed portion further comprises a ring printed portion formed by silk screening on a periphery of the lattice printed portion, and
    wherein the electrically non-conductive printed portion further includes an epoxy ink.

12. The electronic device according to claim 11, wherein the lattice printed portion includes a non-printed region, and the ring printed portion includes no non-printed region.

13. The electronic device according to claim 10, further comprising a fixing hole in the circuit board through which the fixing tool is inserted for fixing the circuit board between the first housing and the second housing, and wherein the electrically non-conductive printed portion is formed around the fixing hole.

* * * * *